INVENTOR.
JOHN W. CROWE

BY [signature]
ATTORNEY

INVENTOR.
JOHN W. CROWE

BY [signature]
ATTORNEY

INVENTOR.
JOHN W. CROWE
BY [signature]
ATTORNEY 3,409,839

METHOD AND APPARATUS FOR MINIMIZING THE EFFECTS OF IONIZING RADIATION ON SEMICONDUCTOR CIRCUITS

John W. Crowe, Woodland Hills, Calif., assignor to North American Rockwell Corporation, a corporation of Delaware Filed Aug. 4, 1965, Ser. No. 477,269
10 Claims. (Cl. 330—33)

The present invention is directed to a method and apparatus for minimizing ionizing radiation induced effects in semiconductor circuits and more particularly to a method and apparatus for neutralizing the charge deposited on the junction of a semiconductor as a result of such radiation.

An impulse of ionizing radiation produces two distinct electrical effects in an operating semiconductor device, namely the generation of primary and secondary photocurrents. The ionizing radiation produces additional charge carriers of both signs (electrons and holes) throughout the material. Most of these charge carriers recombine without producing any external electrical effect. Those produced near a junction, however, may be swept across the junction. This initial flow of charge across the junction constitutes the primary photocurrent. The directions of flow of the two types of carriers are set by the direction of the electric field. Electrons drift toward regions more positive and holes drift toward regions more negative. In all cases of junctions the electrons drift toward the N region and holes drift toward the P region.

In a transistor the primary photocurrent produces a metastable charge distribution at each junction. The charge carriers deposited on the base region are majority carriers in the base and reduce the emitter-base barrier voltage so as to increase the diffusion current into the base, i.e., to forward bias the transistor. This increase in diffusion current is commonly called the secondary photocurrent. Primary photocurrent also flows due to ionization of the emitter-base depletion region but this is ordinarily of negligible magnitude. This forward biased condition of the transistor will continue until the charge deposited on the base is removed. The excess majority carriers constituting this charge may capture minority carriers from the emitter diffusion current and thus be neutralized, or they may diffuse to the base connection and flow out of the transistor through any D-C path to a point of lower potential.

The present invention is directed to a method and apparatus for neutralizing the charge deposited on the junction of a semiconductor by ionizing radiation effects and thereby neutralize the effects of such photocurrent on the operation of the semiconductor circuit.

It is an object of the present invention to provide a method and apparatus to substantially reduce the sensitivity of a semiconductor circuit to ionizing radiation.

It is another object of the present invention to provide a method and apparatus for neutralizing a radiation induced charge and thereby substantially reduce the radiation sensitivity of a semiconductor junction circuit without significantly altering the electrical characteristics of the circuit in which it functions.

It is a further object of the present invention to provide a method and apparatus for compensating for the secondary effects of radiation induced photocurrents.

It is a further object of the present invention to provide a method and apparatus for neutralizing the charge deposited on the base of a transistor as a result of ionizing radiation induced photocurrent.

These and other objects of the present invention will be more apparent from the following detailed description and drawings, made a part thereof, in which.

The present invention is directed to a method and apparatus for compensating for radiation induced photocurrents in a semiconductor circuit. The basic aspect of the present invention is the generation of a compensating photocurrent under irradiation and the introduction of that compensating current into the semiconductor circuit in a manner to essentially neutralize or cancel the radiation induced photocurrent resulting from the irradiation of a circuit semiconductor. The radiation environment to which the present invention is directed is one in which atomic dislocations are not caused, but rather one in which transient effects result. The principal interactions causing ionization in semiconductor devices are (1) the photoelectric effect which involves low energy photons, e.g., less than 1 mev., and (2) high energy electron bombardment. The principal ionizing radiation of this type is gamma rays. Specifically, x-ray bursts of about 0.1$\mu$ sec. duration delivering a dose of from about 0.1 to about 0.5 R. per pulse to the semiconductor were utilized as a basis for characterizing the compensation attained by the method and apparatus of the present invention.

Another aspect of the present invention is the further compensation for radiation induced photocurrent effects in the circuit load. This effect is generally small compared to the induced photocurrent effect in the semiconductor.

These two aspects are described herein as applied to transistors although they are equally applicable to elemental diodes since the radiation induced current which is compensated for is that current flowing in one of the junctions of the transistor. The current flow in the other junction of the transistor is very small and therefore no compensation is ordinarily required. The specific embodiments described are directed to well known common emitter amplifier circuits for the purpose of illustration However, it is within the purview of the present invention to utilize the method and apparatus in other semiconductor circuits which, when exposed to ionizing radiation, produces primary photocurrents in the semiconductor materially effecting the electrical characteristics of the circuit in which it is utilized.

Figure 1:
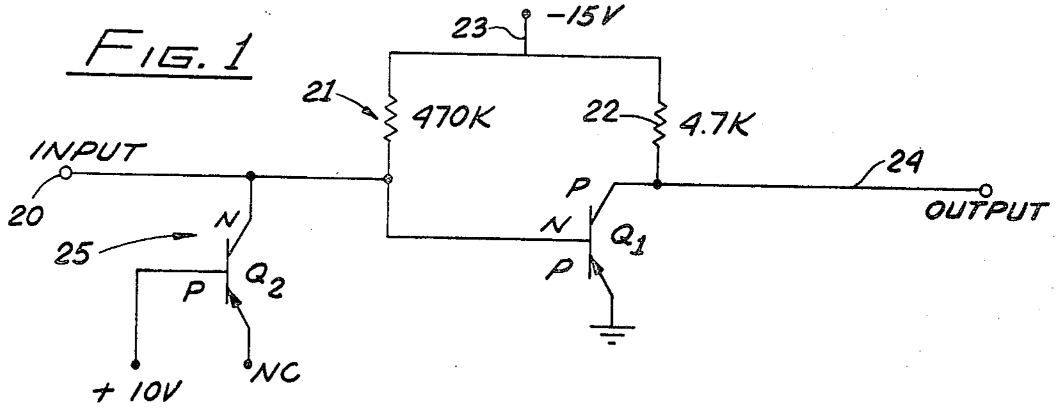
FIG. 1 is a circuit diagram of the modified common emitter amplifier of the present invention.

Referring to the drawings in detail, the circuit of FIG. 1 is basically a transistor amplifier circuit having an input 20, a transistor $Q_1$ (2N1224) and a biasing network including resistors 21 and 22, a voltage source 23, an output 24 and a primary radiation induced photocurrent compensating network 25. The compensating network 25 includes a reverse-biased diode $Q_2$ (2N1224) connected from the base of $Q_1$ to a more positive point, i.e., a positive voltage source. The emitter of $Q_2$ is not connected in the circuit. Thus, $Q_2$ functions as an elemental diode in the network of FIG. 1. The introduction of the compensating network 25 has essentially no effect on the electrical properties of the circuit during normal operation since the reverse-biased diode $Q_2$ is similar to a very small capacitor and a very high resistor in parallel.

When $Q_1$ is exposed to ionizing radiation a primary photocurrent is induced which flows in the transistor $Q_1$ itself and deposits electrons in the base region with the result that the transistor is forward biased and the emitter-to-base barrier voltage is reduced. If this photocurrent is not compensated for the net electrical effect is to materially change the electrical characteristics of the circuit.

Figure 2:
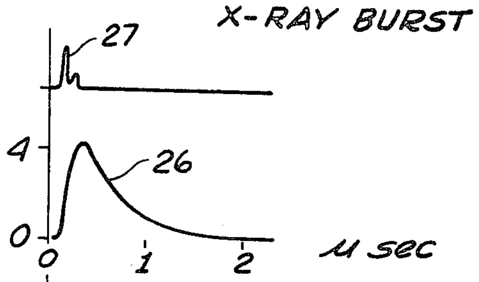
FIG. 2 is a graph of the radiation induced voltage effects in a common emitter amplifier without compensating network.
Figure 3:
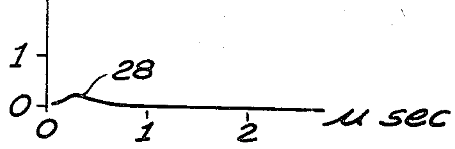
FIG. 3 is a graph of the radiation induced effects utilizing the modified circuit of FIG. 1.

Thus, as is apparent from FIG. 2, the voltage induced, curve 26, as a result of an X-ray burst, curve 27, is very large. However, when the compensating network 25 is utilized this induced voltage effect is reduced by a factor of twenty as shown by curve 28 of FIG. 3. No special effort was made in selecting $Q_2$ to provide optimum response and therefore further improvement in compensation would be expected through the use of selecting procedures. The compensating network 25, as a result of the radiation, generates a compensating photocurrent which deposits holes in the base of $Q_1$. To the extent that these charge carriers deposited in the base region by compensating network 25 are equal in number to the electrons generated by the radiation effect on the transistor $Q_1$, they neutralize each other in their effect on the operation of $Q_1$ and render the circuit essentially unaffected by the radiation.

While the gross effects of radiation on the basic circuit of FIG. 1 are neutralized by the compensating network 25, several minor effects are not fully neutralized. Thus, the lifetimes of the opposite types of charge carriers deposited on the base region are not the same. This is apparent when it is considered that each type of carrier may recombine with a carrier of the opposite type resulting in a net zero effect. Minority carriers may drift out at any of the junctions of $Q_1$ which have fields in the proper direction for such drift. Majority carriers, however, may not drift out since the fields at all the junctions facing the base region oppose such drift. The net lifetime of majority carriers therefore tends to be longer than that of minority carriers. Since the charge deposited in $Q_1$ by ionizing radiation in the transistor junction consists of majority carriers in the base region, this charge tends to persist longer than the compensating charge deposited by the compensating network 25. This difference in lifetime, as well as other minor effects, results in minor time constant discrepancies between the two gross charge decay times. However, these time constant discrepancies may be minimized, if desired, by the judicious selection of the compensating junction $Q_2$, the reverse bias voltage on $Q_2$ and variations in the circuit parameters of any electrical network in series with the junction $Q_2$, e.g., a delay network.

The selection of the junction $Q_2$ is determined by both the magnitude of the primary radiation sensitivity and internal electrical properties. However, the radiation sensitivity of $Q_2$ may be varied by adjusting its reverse bias voltage since the variation in that voltage changes the carrier depletion region width and this region is the radiation sensitive region. The junction $Q_2$, while shown in FIG. 1 as a transistor utilizing the base to collector junction, may utilize the base to emitter junction, or may be an elemental diode. The junction $Q_2$ functions as a reverse bias diode with the emitter not connected. However, some control over the diode characteristic is desired and the emitter may be connected to the base or some other control system, although it will still function essentially as a reverse biased diode system.

Figure 4:
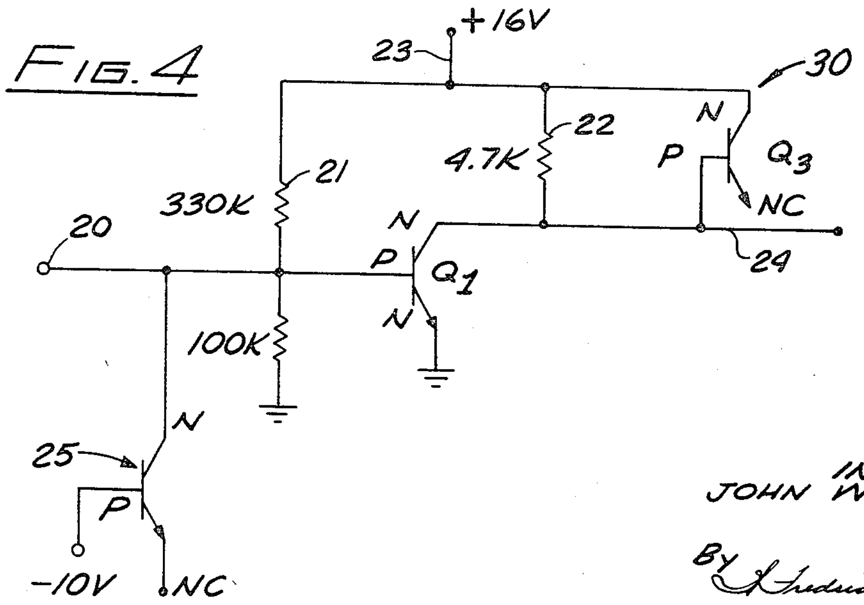
FIG. 4 is a circuit diagram of another embodiment of the present invention utilizing a secondary current compensating network.

In addition to the imperfect cancellation of radiation effects resulting from carrier lifetime variations, the presence of a transient voltage in the collector load circuit of $Q_1$ resulting from the voltage drop also introduces circuit response variations. Thus, the primary photocurrent flowing in the collector junction causes a voltage drop across load resistor 22. This transient voltage component does not ordinarily make any large contribution to the residual radiation induced signal unless the effect of the base charge has been reduced by a factor approaching the current gain of the transistor $Q_1$. When this reduction has been attained the secondary effects may be compensated for separately by the addition of a second compensating network 30 as shown in FIG. 4.

Figure 5:
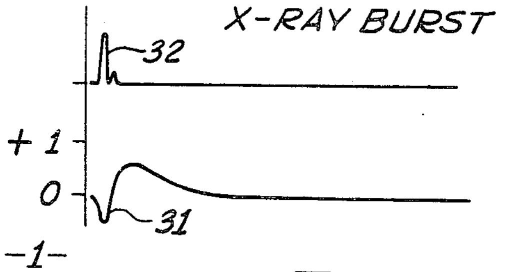
FIG. 5 is a graph of the radiation induced voltage effects without the secondary current compensating network.
Figure 6:
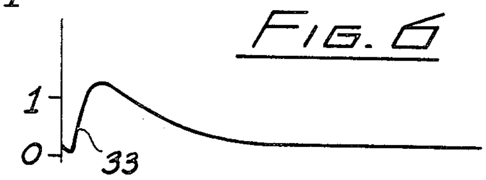
FIG. 6 is a graph of the radiation induced voltage effects utilizing the secondary current compensating network.

In this embodiment a second compensating network 30 is provided which comprises a junction $Q_3$ (2N697), shown as a transistor utilizing the base to collector junction but which may utilize the base to emitter junction or may be an elemental diode. The junction $Q_3$ is connected between the bias voltage source and the output 24. In this manner there is a net flow of charge away from the collector terminal of $Q_2$ (2N697) resulting from the unbalance in the primary photocurrents in the transistor and in the compensating junction $Q_3$. The output voltage signal at 24 is the product of that unbalance current and the impedance from the collector of $Q_1$ (2N697) to ground. The results of the compensation utilizing both compensating circuit 25 and 30 are shown in FIGS. 5 and 6. In FIG. 5 the induced voltage flow in the circuit load resistor 22 is shown as the negative going portion 31, resulting from an X-ray burst, curve 32. The positive portion of this curve results from the imperfect cancellation in the base circuit with a small amount of overcompensation. However, when the compensating network 30 is utilized the magnitude of this induced voltage was reduced by a factor of five. Thus, as is apparent from the curve of FIG. 6, the addition of $Q_3$ demonstrates cancellation of the effect of primary photocurrent flowing in the load resistor 22. This cancellation leaves as a residue signal in the load resistor the voltage drop due to secondary photocurrent which in turn results from an imperfect balance of the two primary photocurrents flowing into the base. In this particular case the effect results from a slight degree of overcompensation for the ionization effects on $Q_1$.

Figure 7:
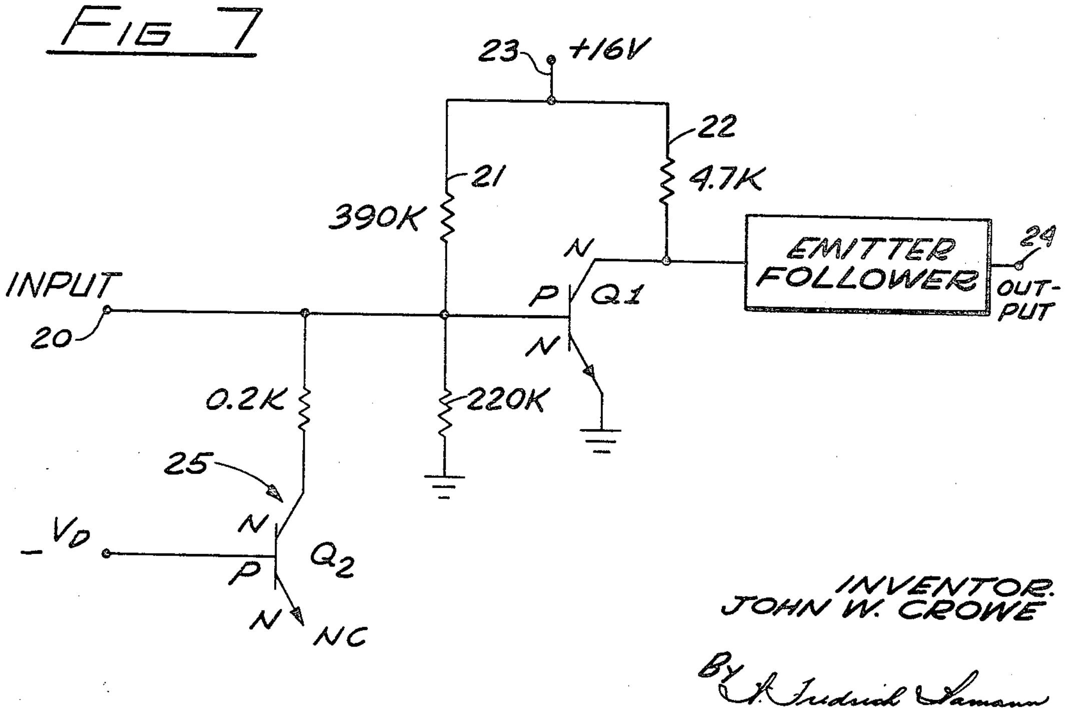
FIG. 7 is a modified compensating circuit of FIG. 1.
Figure 8:
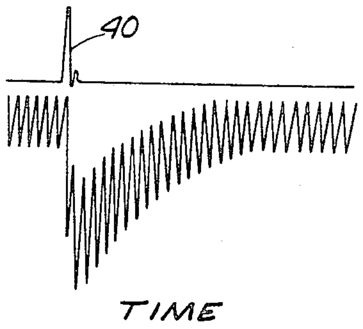
FIGS. 8–11 are graphs showing the effect of various biasing voltages in compensating for radiation induced effects in the circuit of FIG. 7.
Figure 9:
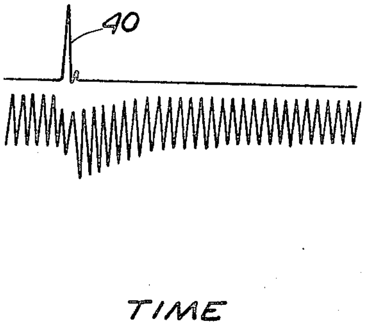
Figure 10:
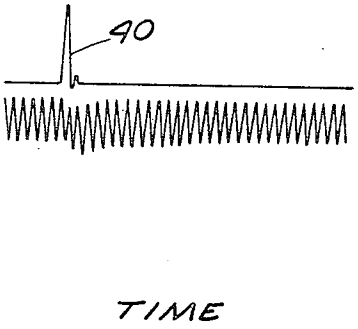
Figure 11:
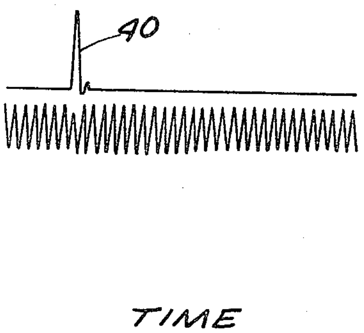

The magnitude of the compensation may be varied by control of the reverse bias on the compensating junction. Thus, mere addition of the compensating junction $Q_2$ with as small a reverse bias as the voltage developed across the base to emitter junction of the operating transistor $Q_1$ substantially reduced the sensitivity of the circuit to radiations. Increasing the bias voltage of $Q_2$ increases the primary photocurrent of $Q_2$ to increase compensation. Further, the circuits retain their electrical integrity after being exposed to radiation. These characteristics are illustrated in FIGS. 7–11. In FIG. 7 a modified compensated transistor amplifier circuit is shown which operates in essentially the same manner as the circuit of FIG. 1. FIG. 8 shows the response of this circuit when a 5 mc. continuous wave signal is applied and no compensating network is utilized. The resulting effects induced as a result of an X-ray burst 40 is shown by the large temporary curve displacement illustrating that following the radiation pulse the gain of transistor $Q_1$ to the 5 mc. wave is higher than the steady state gain. This is due to the fact that the operating point of the transistor is shifted to a point of greater conductance by the radiation induced base voltage change. FIG. 9 shows the effect of compensating network 25 with no biasing voltage applied to $Q_2$. Thus, the mere presence of the elemental diode of compensating network 25 has a substantial effect in compensating for the radiation induced current. The effect of various biasing voltages is illustrated in FIG. 10, for a bias voltage of —15 v. and FIG. 11, for a bias voltage of —25 v. It is clear that essentially total compensation can be attained by selecting the biasing voltage $V_D$ to accommodate the change in characteristics of $Q_1$ resulting from a radiation pulse.

While the above described embodiments have utilized single transistor amplifier circuits the compensating method and apparatus of the present invention may also be applied to other circuits, such as, common base and common collector circuits.

Figure 12:
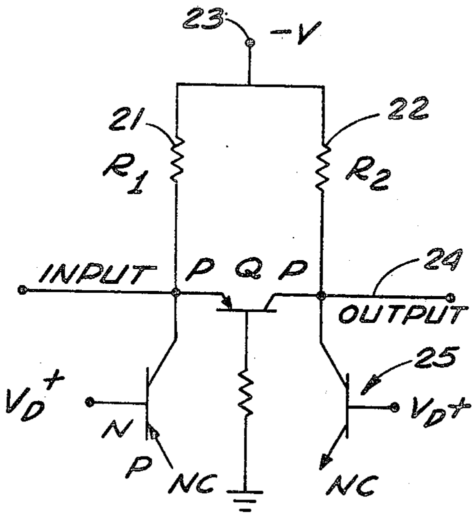
FIG. 12 is a circuit diagram of another embodiment of the present invention.

In the common base semiconductor utilizing a PNP transistor (see FIG. 12) the compensating network 25, comprising a PN junction with the N region connected to a positive voltage source, may be utilized to compensate for radiation induced currents in both the collector and emitter circuits. Thus, such a network using $Q_2$ would be connected to the emitter and a second compensating network using $Q_2'$, connected to the collector (output 24) of the circuit. Both networks would function to compensate and cancel radiation induced currents flowing into the base of transistor $Q_1$. Further, the method and apparatus of the present invention is not limited in application to single stage circuits and may be utilized in multistage circuits utilizing various combinations of the well known common emitter, common base and common collector circuits. In the multistage circuit arrangements, however, the second stage is loaded by the output of the first stage and the contribution of the first stage is amplified by the normal operation of the second. Thus, the second stage is less sensitive to radiation in terms of the effect on circuit operation characteristics. Therefore, only a single compensating network is usually required and that is utilized in the first stage. For example, the use of a single compensating junction without voltage bias across one of the biasing resistors in the input stage of a two stage, single ended pulse emitter follower resulted in a reduction of radiation sensitivity by a factor of about twenty. It is equally clear that the compensating method and apparatus of the present invention is applicable to diode rectifying circuits and to other semiconductor circuits such as flip-flops, gates and trigger and detector circuits. While the present invention has been described emphasizing its application to three terminal transistors having a base, emitter and collector, it is also applicable to diodes and to field effect transistors of both the junction and insulated gate type. Thus, in the field effect transistor case the effect of ionizing radiation is to make the device more conducting and therefore the compensating networks described above may be utilized to bias the device to make it less conducting. It is therefore apparent that the method and apparatus of the present invention is applicable to a wide variety of semiconductor circuits for compensating for radiation effects induced in semiconductor junctions.

Although particular embodiments of the present invention have been described, various modifications will be apparent to those skilled in the art without departing from the scope of the invention. Therefore, the present invention is not limited to the specific embodiments disclosed but only by the appended claims.

I claim:

1. A method for at least partially eliminating the effects of a photocurrent induced in a semiconductor junction in a circuit by ionizing radiation incident thereon comprising the steps of generating a compensating current in response to ionizing radiation which is essentially equal to said induced photocurrent and introducing said compensating current into said circuit to essentially neutralize the effects of said induced photocurrent current in said semiconductor.

2. The method of claim 1 wherein said compensating current is introduced into said semiconductor.

3. A method for at least partially eliminating the effects of a photocurrent induced in a semiconductor by ionizing radiation incident upon an electronic circuit having at least one three terminal transistor wherein said first photocurrent biases said transistor to a more conductive condition, comprising the steps of generating a compensating current which is essentially equal to said induced photocurrent, and introducing said compensating current into said circuit so that said compensating current biases said transistor to a less conductive condition to neutralize the biasing resulting from said induced photocurrent.

4. A method for at least partially eliminating the effects of a photocurrent induced by ionizing radiation incident upon at least one semiconductor junction in an electronic circuit having a load resistor, said radiation induced photocurrent passing through said load resistor, comprising the steps of generating a first compensating current which is essentially equal to said induced photocurrent, introducing said compensating current into said cicuit so that it flows into said semiconductor to essentially neutralize the effects of said radiation induced photocurrent upon said semiconductor, generating a second compensating current essentially equal to the said induced photocurrent and introducing said second current into said load resistor to compensate for effects of said induced photocurrent upon voltage drop across said load resistor.

5. In an electronic circuit having at least one semiconductor junction, means for neutralizing the photocurrent induced in said junction by ionizing radiation incident thereon comprising compensating means, said compensating means upon exposure to ionizing radiation generating a current which is essentially equal to said induced photocurrent in said junction, and means connecting said compensating means to one side of said junction in a manner such that said generated current at said junction has a polarity opposite to that of said induced photocurrent.

6. The device of claim 5 wherein said semiconductor junction includes the base of a transistor, said base being connected to an input of said circuit, and said compensating means having its output connected to said input.

7. In an electronic circuit having at least one semiconductor junction, means for neutralizing the photocurrent induced in said junction by ionizing radiation incident thereon which forward biases said junction comprising, biasing means including at least one diode junction, said diode junction upon exposure to ionizing radiation generating a current which is essentially equal to said induced photocurrent in said semi-conductor junction, and means connecting one side of said diode junction to one side of said semiconductor junction so that said generated current connected to said semiconductor junction has a polarity opposite to that of said induced photocurrent.

8. The device of claim 7 wherein said electronic circuit is a transistor amplifier circuit, said at least one junction is the collector-base junction, and said one side of said semiconductor junction is the base.

9. The device of claim 7 wherein said electronic circuit is a transistor amplifier, said at least one junction is the emitter-base junction, and said one side of said semiconductor junction is the emitter.

10. The device of claim 7, wherein said semi-conductor has an associated load resistor, including a second biasing means connected in parallel with said load resistor of said semiconductor junction.

No references cited.

JOHN KOMINSKI, *Primary Examiner.*